(12) United States Patent
Cheruiyot et al.

(10) Patent No.: US 8,513,957 B2
(45) Date of Patent: Aug. 20, 2013

(54) IMPLEMENTING INTEGRAL DYNAMIC VOLTAGE SENSING AND TRIGGER

(75) Inventors: Kennedy K. Cheruiyot, Rochester, MN (US); Joel T. Ficke, Blommer, WI (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 12/792,160

(22) Filed: Jun. 2, 2010

(65) Prior Publication Data

US 2011/0298474 A1 Dec. 8, 2011

(51) Int. Cl.
*G01R 29/26* (2006.01)
*H03L 7/00* (2006.01)
*H03K 3/03* (2006.01)

(52) U.S. Cl.
USPC .............................. 324/613; 331/2; 331/46

(58) Field of Classification Search
USPC .................... 324/613–614; 331/78
See application file for complete search history.

(56) References Cited

U.S. PATENT DOCUMENTS

| 4,725,748 | A | * | 2/1988 | Hayes et al. | 327/277 |
| 5,592,118 | A | * | 1/1997 | Wilmot et al. | 327/440 |
| 5,729,169 | A | * | 3/1998 | Roohparvar | 327/227 |
| 6,473,852 | B1 | * | 10/2002 | Hanjani | 713/1 |
| 6,605,929 | B2 | | 8/2003 | Tsukagoshi et al. | |
| 6,621,349 | B2 | | 9/2003 | Mullgrav, Jr. | |
| 6,823,293 | B2 | | 11/2004 | Chen et al. | |
| 7,301,320 | B2 | | 11/2007 | Dreps et al. | |
| 7,359,811 | B1 | | 4/2008 | Liu | |
| 7,443,187 | B2 | | 10/2008 | Jenkins et al. | |
| 8,040,988 | B2 | * | 10/2011 | Chang et al. | 375/354 |

OTHER PUBLICATIONS

Ogasahara, Y. et. al., "Dynamic Supply Noise Measurement Circuit Composed of Standard Cells Suitable for In-Site SoC Power Integrity Verification," 978-1-4244-1922.

* cited by examiner

*Primary Examiner* — Melissa Koval
*Assistant Examiner* — Brent J Andrews
(74) *Attorney, Agent, or Firm* — Joan Pennington

(57) ABSTRACT

A method and circuit for implementing dynamic voltage sensing and a trigger circuit, and a design structure on which the subject circuits resides are provided. The voltage sensing circuit includes a first quiet oscillator generating a reference clock, and a second noisy oscillator generating a noisy clock. A digital control loop coupled to the first quiet oscillator and the second noisy oscillator matches frequency of the first quiet oscillator and the second noisy oscillator. The reference clock drives a first predefined-bit shift register and the noisy clock drives a second predefined-bit shift register, where the second predefined-bit shift register is greater than the first predefined-bit shift register. When the first predefined-bit shift register overflows, the contents of the second predefined-bit shift register are evaluated. The contents of the second predefined-bit shift register are compared with a noise threshold select value to identify a noise event and trigger a noise detector control output.

17 Claims, 3 Drawing Sheets

IMPLEMENTING INTEGRAL DYNAMIC VOLTAGE SENSING AND TRIGGER

FIELD OF THE INVENTION

The present invention relates generally to the data processing field, and more particularly, relates to a method and circuits for implementing voltage sensing and trigger, and a design structure on which the subject circuits resides.

DESCRIPTION OF THE RELATED ART

As complementary metal oxide semiconductor (CMOS) noise margins continue to become smaller, guarding against excessive instantaneous voltage compression has become a significant part of modern chip release processes. For example, it is not uncommon to have noise specific reviews, noise tool checkpoints, decoupling capacitor placement guidelines and voltage compression targets all put in place to protect against this problem; however, the entire process is built on simulation results and empirical field feedback rather than direct measurement of instantaneous voltage at circuit terminals.

Techniques for direct measurement have been proposed, but these techniques appear to fall short when practically implemented due to calibration requirements, process variation, power and size requirements, and the like.

Given the importance of this problem to the industry, circuits for direct measurement, which provide insight and understanding while being easy to implement would provide significant value for current and future IC technologies.

SUMMARY OF THE INVENTION

Principal aspects of the present invention are to provide a method and circuit for implementing voltage sensing and trigger, and a design structure on which the subject circuit resides. Other important aspects of the present invention are to provide such method, circuitry and design structure substantially without negative effect and that overcome many of the disadvantages of prior art arrangements.

In brief, a method and circuit for implementing dynamic voltage sensing and a trigger circuit, and a design structure on which the subject circuits resides are provided. The voltage sensing circuit includes a first quiet oscillator generating a reference clock, and a second noisy oscillator generating a noisy clock. A digital control loop coupled to the first quiet oscillator and the second noisy oscillator matches frequency of the first quiet oscillator and the second noisy oscillator. The reference clock drives a first predefined-bit shift register and the noisy clock drives a second predefined-bit shift register, where the second predefined-bit shift register is greater than the first predefined-bit shift register. When the first predefined-bit shift register overflows, the contents of the second predefined-bit shift register are evaluated. The contents of the second predefined-bit shift register are compared with a noise threshold select value to identify a noise event and trigger a noise detector control output.

In accordance with features of the invention, the voltage sensing circuit and trigger circuit are fabricated on chip. The first predefined-bit shift register includes for example, an N-bit shift register and the second predefined-bit shift register includes for example, a 2N-bit shift register. The magnitude of noise on a monitored voltage supply affects the 1->0 boundary inside the 2N-bit shift register.

In accordance with features of the invention, a pair of multiple input multiplexers are connected to selected latches of the second predefined-bit shift register and a noise threshold select input to the multiple input multiplexers control the sensitivity of the noise event detection.

In accordance with features of the invention, an array, such as, a 2N×M array is connected to the respective latches 1-2N of the 2N-bit shift register, providing storage for a predefined number M of evaluations of the 2N-bit shift register. The noise detector control output is used to control the operation of the array. For example, responsive to the noise detector control output being activated, the array begins to fill up with data. Alternatively, the array is continuously being filled with data with newest data replacing oldest data. Then, responsive to the noise detector control output being activated, the array captures the noise event and maintains the captured noise event data until the array is read.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing voltage sensing and a trigger circuit, and a design structure on which the subject circuits resides are provided. The circuit provides in situ or integral voltage monitor, using two clocks on chip, one from the noisy environment of interest, such as an oscillator designed into a macro of interest, and the other from a quiet environment, such as a phase locked loop (PLL) or other independent oscillator design. Low power, compact circuits are used, which do not require calibration to measure and display power supply compression fluctuation, and provide a novel trigger mechanism. The circuits of the invention are not susceptible to process variation, provide easily interpreted results, and are only activated when significant power supply compression occurs.

Figure 1:
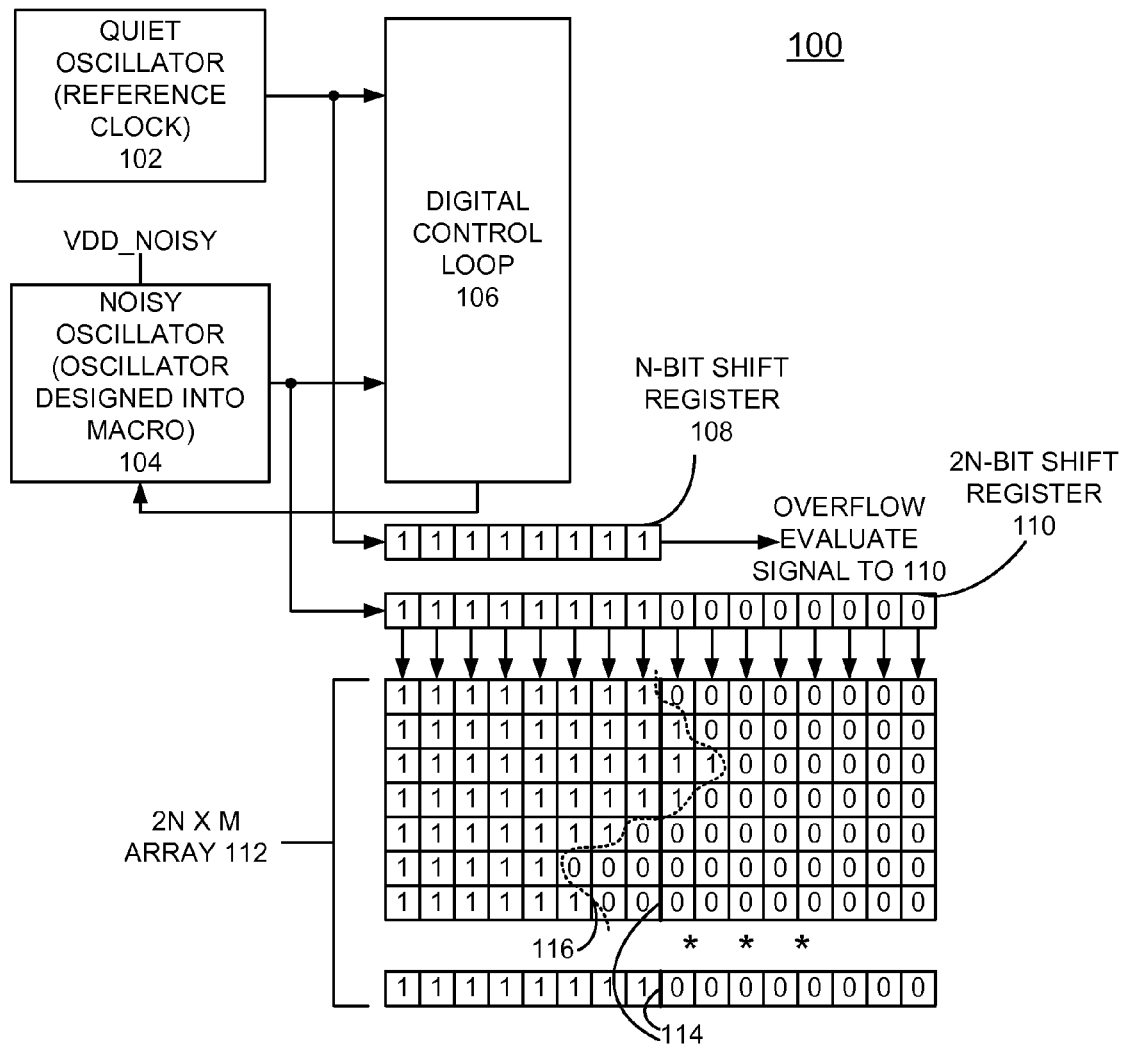
FIGS. 1 and 2 are schematic diagram of an exemplary circuit for implementing voltage sensing and trigger in accordance with the preferred embodiment.
Figure 2:
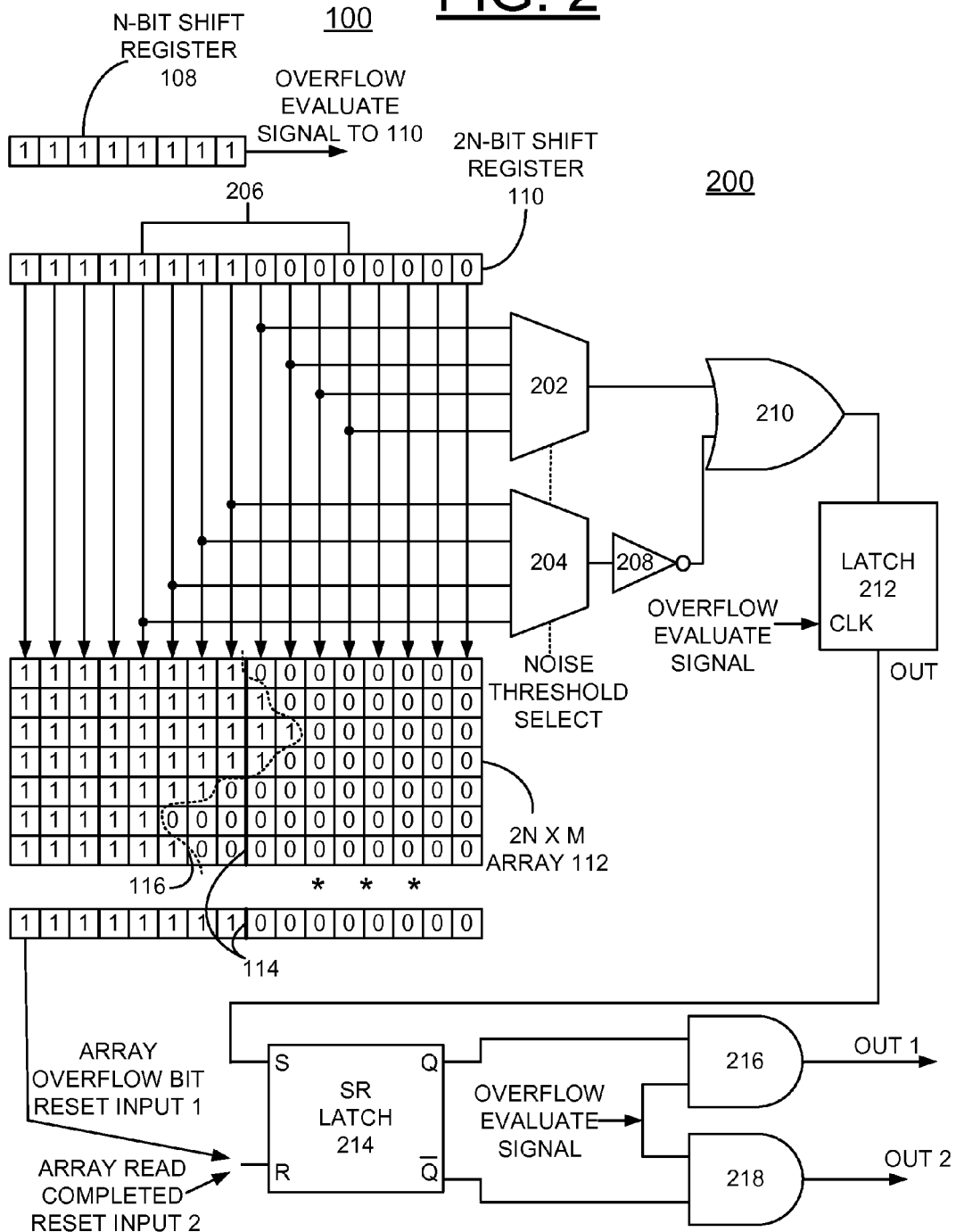

Having reference now to the drawings, in FIGS. 1 and 2, there are shown a circuit generally designated by the reference character 100 for implementing voltage sensing including a trigger circuit generally designated by the reference character 200 in accordance with the preferred embodiment. Voltage sensing circuit 100 is an on-chip, high frequency power supply noise monitoring circuit requiring low chip area to implement, and which does not require calibration. Voltage sensing circuit 100 includes the trigger circuit 200, which turns on power supply measurement operation when a predetermined or pre-programmed voltage drop is reached. Voltage sensing circuit 100 provides an easily viewed voltage compression output with history.

Circuit 100 includes a first quiet oscillator 102 generating a reference clock, and a second noisy oscillator 104 generating a noisy clock. The first quiet oscillator 102 and the second noisy oscillator 104 are fabricated on chip, each providing high frequency clocks. The second noisy oscillator 104 receives a voltage supply rail VDD_NOISY of a power supply being monitored. A digital control loop 106 receives a respective output clock from the first quiet oscillator 102 and the second noisy oscillator 104 and controls the second noisy oscillator to match frequency of the first quiet oscillator. The digital control loop 106 is a relatively slow control so that the frequency matching operation would not respond to noise spikes. The digital control loop 106 eliminates the need for calibration.

It should be understood that circuit 100 is not limited to the illustrated oscillators 102, 104, and digital control loop 106. For example, an available quiet clock from a nearby phase locked loop (PLL) could implement the quiet oscillator 102 and the noisy oscillator could be frequency locked to that PLL via the digital low frequency control loop. Alternatively, a digital averaging circuit could be used to calibrate out offset replacing the digital control loop 106.

The reference clock generated by the first quiet oscillator 102 drives a first counter or a first predefined-bit shift register 108 and the noisy clock of the second noisy oscillator 104 drives a second counter or a second predefined-bit shift register 110, where for example, the first predefined-bit shift register 108 is an N-bit shift register and the second predefined-bit shift register is a 2N-bit shift register, as shown.

Circuit 100 includes a 2N×M array 112 connected to respective latches 1-2N of the second 2N-bit shift register 110. Operation of the 2N×M array 112 is selectively controlled by the trigger circuit 200 for monitoring noise or power supply compression fluctuation. A no noise boundary is indicated by a thick vertical line 114 within the 2N×M array 112, and a dotted line 116 within the 2N×M array 112 indicates a data 1->0 boundary. Once static offsets are equilibrated by operation of the digital control loop 106, voltage compression fluctuations of the supply voltage VDD_NOISY change the relative position of the 1->0 boundary 116 as shown within array 112. The trigger circuit 200 allows selected noise monitoring operation of the 2N×M array 112 to activate only after a pre-programmed compression target is reached.

In accordance with features of the invention, the monitoring operation of the voltage sensing circuit 100 can be used to determine noise characteristics in one of three ways as follows:
1. Amplitude of noise, for example, record noise profile when VDD_NOISY drops below a threshold voltage or spikes above a threshold voltage.
2. Duration of noise, for example, record noise profile when VDD_NOISY drops below a voltage for a specific period of time.
3. Combination of amplitude and duration.

Referring now to FIG. 2, the trigger circuit 200 of the voltage sensing circuit 100 includes a pair of 4-input multiplexers 202 and 204, each having a selected noise threshold select input. Predefined selected latches 206 of the 2N-bit shift register 110 provide respective inputs of the multiplexers 202 and 204. The predefined selected latches 206 are selectively spaced above and below the no noise boundary 114 within the 2N×M array 112 to selectively define the pre-programmed compression target with the selected noise threshold select input applied to multiplexers 202 and 204. An output of multiplexer 202 and an inverted output of multiplexer 204 provided by an inverter 208 are applied to respective input of an OR gate 210.

Operation of the voltage sensing circuit 100 and trigger circuit 200 may be understood as follows. When the first N-bit shift register 108 overflows, the contents of the second 2N-bit shift register 110 are evaluated. Alternatively, when a counter is used in place of the N-bit shift register 108, then the counter resets based on counter depth (N). The magnitude of noise on the monitored voltage supply VDD_NOISY affects the 1->0 boundary inside the 2N-bit shift register 110. For example, when VDD_NOISY has no noise, the N-bit shift register 108 and the 2N-bit shift register 110 will clock in synch and the 1->0 boundary will lie between the 8th and 9th bit of the 2N-bit register. A noise droop on Vdd will cause the 1->0 boundary to go down, a noise spike on Vdd will cause the 1->0 boundary to go up. The select lines of the multiplexers 202, 204 control the sensitivity of the noise detection. The contents of the selected latches 206 of the second predefined-bit shift register 110 are selected based on the noise threshold select value applied to multiplexers 202 and 204 and coupled by the multiplexers 202 and 204 and the inverter 208 to the OR gate 210 to identify a noise event and to trigger a noise monitor control operation.

For example, the output of OR gate 210 remains at a logic 0 until a noise event has occurred that caused the 1->0 boundary to move beyond the noise threshold select multiplexer input. Then the output of OR gate 210 is driven high in response to the noise event.

The output of OR gate 210 is connected to the data input of a latch 212. The clock input of the latch 212 is connected to the overflow evaluation signal from N-bit shift register 108. The output of latch 212 is connected to the set (S) input of a SR (set-reset) latch 214. The output of the SR latch 214 is applied to an AND gate 216 for a first embodiment and the inverted output of the SR latch 214 is applied to an AND gate 218 for a second embodiment of the trigger circuit 200.

In the first embodiment of the trigger circuit 200, an array overflow bit from the 2N×M array 112 that indicates when the array 112 is full is applied to the reset (R) of the SR latch 214 indicated at a line labeled ARRAY OVERFLOW BIT RESET INPUT 1. The AND gate 216 is connected to the output of the SR latch 214 and the overflow evaluation signal from N-bit shift register 108 is applied to the second input of AND gate 216. The output of the AND gate 216 labeled OUT 1 is used to clock the data into the 2N×M array 112. For example, before the noise detector is activated, the SR latch 214 is in the reset state and the output is low. This gates the overflow evaluation signal from arriving at the 2N×M array 112 so no data is captured by the array. When the noise detector output is activated, the output of latch 212 goes high which sets the SR latch 214. The output of SR latch 214 goes high which allows the overflow evaluation signal to clock data into the array 112. The array 112 fills with data, continuing until M copies of the 2N-bit shift register 110 values are received. The SR latch 214 goes into a reset state once the array overflow bit generates the all full signal for the 2N×M array 112 that is applied to the reset of the SR latch. Alternatively this reset input signal can be generated through an overflow bit of a counter having a depth, M that is the same as the array 112.

When SR latch 214 is reset, its output and the output of AND gate 216 goes low which gates further clocking of the 2N×M array 112.

In a second embodiment, the reset of the SR latch 214 is connected to an external clear signal that goes high after the contents of the array have been read indicated at a line labeled ARRAY READ COMPLETED RESET INPUT 2. Then the inverted output (Q-bar) of the SR latch 214 is connected to an AND gate 218 that receives the overflow evaluation signal at a second input of the AND gate 218. The output of the AND gate 218 labeled OUT 2 is used to clock the data into the 2N×M array 112. For example, before the noise detector 100 is activated, the SR latch 214 is in the reset state and the inverted output is high. This allows the overflow evaluation signal to clock the array 112 through the AND gate 218. In normal operation, the array 112 is continuously filling with data with newest data replacing oldest data. When the noise detector output is activated, the output of latch 212 goes high which sets the SR latch 214. The inverted output of SR latch 214 goes low which gates the overflow evaluation signal from further clocking data into the array 112. As a result when the noise detector control output triggers, data currently in the array 112 is frozen until the contents of the array 112 have been read out. Once the array had been read, and external clear signal resets the SR latch, 214 again allowing data to be clocked into the array 112.

As a variation to this second embodiment using the AND gate 218, the noise detection circuitry could monitor a selected point within the 2N×M array 112. For example, the noise monitor 200 could look for a noise event half way through the array (M/2) so when the data is frozen, the array contains noise signature information for the period before, during and after the noise event.

It should be understood that the voltage sensing circuit 100 including the trigger circuit 200 are not limited to the illustrated embodiments, other logic gates and functional blocks could be used to implement these circuits as would be apparent to one skilled in the art.

An example calculation demonstrating voltage measurement robustness follows. Assume an 8-bit counter implementing the N-bit shift register 108. The counter will produce 64 logic zeros and 64 logic ones before reset and the shift register 110 is 128 latches wide. Assume the quiet ring oscillator (RO) 102 is running at 10 GHz and that the quiet oscillator 102 and noisy oscillator 104 have reached static equilibrium by operation of the digital control loop 106. In the noisy environment a transient compression droop now occurs which causes the RO frequency of noisy oscillator 104 to drop 15% or to 8.5 GHz. At 10 GHz, it takes 12.8 ns for counter data to generate (0.1 ns period*128 cycles), but in the shift register 110 the noisy clock is now running at a slower 0.1176 ns period, so only 109 of the 128 counter bits will be shifted into the register, or said differently, the 0->1 boundary will be off-center by 19 bits.

Using the same counter for shift register 108 and 128-bit shift register 110, assume a different noisy oscillator 104 is running at 7 GHz and that the quiet oscillator 102 and noisy oscillator 104 have reached static equilibrium and a similar 15% droop in power supply compression so that the noisy oscillator 104 suddenly slows to 5.95 GHz. In this case it will take 18.28 ns to generate counter data and during that time, only 109 of the 128 counter bits will get shifted into the register. Notice that the same 0->1 boundary offset of 19 bits occurs in both cases. This demonstrates the relative insensitivity of this measurement method to process and environmental changes, such as temperature, as well as the ease of use of this approach.

Figure 3:
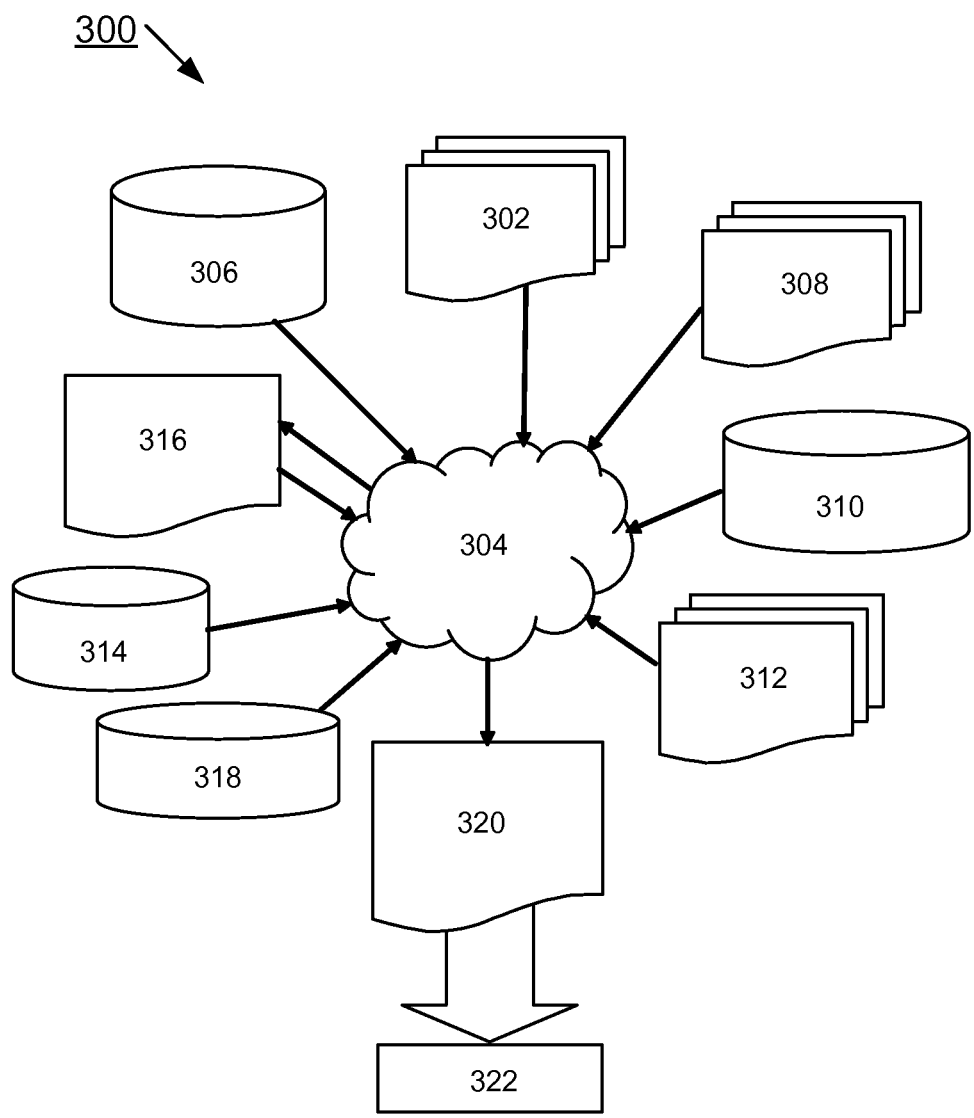
FIG. 3 is a flow diagram of a design process used in semiconductor design, manufacturing, and/or test.

FIG. 3 shows a block diagram of an example design flow 300 that may be used for circuit 100 and trigger circuit 200 described herein. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuits 100, 200 in the form of schematics or HDL, a hardware-description language, for example, Verilog, VHDL, C, and the like. Design structure 302 may be contained on one or more machine readable medium. For example, design structure 302 may be a text file or a graphical representation of circuits 100, 200. Design process 304 preferably synthesizes, or translates, circuits 100, 200 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 308 which may house a set of commonly used elements, circuits, and devices, including models, layouts, and symbolic representations, for a given manufacturing technology, such as different technology nodes, 32 nm, 45 nm, 90 nm, and the like, design specifications 310, characterization data 312, verification data 314, design rules 316, and test data files 318, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIGS. 1 and 2 along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 2. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing dynamic voltage sensing comprising:
   providing a first quiet oscillator generating a reference clock,
   providing a second noisy oscillator generating a noisy clock;
   matching a frequency of the first quiet oscillator and the second noisy oscillator;
   using the reference clock, driving a first predefined-bit shift register;
   using the noisy clock, driving a second predefined-bit shift register, said second predefined-bit shift register being greater than the first predefined-bit shift register;
   evaluating the contents of said second predefined-bit shift register responsive to an overflow of said first predefined-bit shift register; and
   comparing the contents of said second predefined-bit shift register with a noise threshold select value to identify a noise event and trigger a noise detector control output using a pair of multiple input multiplexers connected to selected latches of said second predefined-bit shift register and applying a noise threshold select input to the multiple input multiplexers control the sensitivity of the noise event detection; said comparing for identifying said noise event based upon a selected amplitude of noise or a duration of noise for a specific period of time or a combination said selected amplitude of noise and said duration of noise for said specific period of time.

2. The method for implementing dynamic voltage sensing as recited in claim 1 wherein providing a second noisy oscillator generating a noisy clock includes providing an on-chip oscillator having a noisy voltage supply input.

3. The method for implementing dynamic voltage sensing as recited in claim 1 wherein providing a first quiet oscillator and providing a second noisy oscillator includes providing a respective on-chip high frequency oscillator.

4. The method for implementing dynamic voltage sensing as recited in claim 1 includes providing an array coupled to said second predefined-bit shift register, and storing a predetermined number of evaluations of said second predefined-bit shift register in said array.

5. The method for implementing dynamic voltage sensing as recited in claim 4 includes controlling said array using said noise detector control output.

6. A circuit for implementing dynamic voltage sensing and including a trigger circuit, said circuit comprising:
   a first quiet oscillator generating a reference clock,
   a second noisy oscillator generating a noisy clock;
   a digital control loop matching a frequency of said first quiet oscillator and said second noisy oscillator;
   a first predefined-bit shift register being driven by the reference clock;
   a second predefined-bit shift register being driven by the noisy clock, said second predefined-bit shift register being greater than the first predefined-bit shift register;
   said second predefined-bit shift register being evaluated responsive to an overflow of said first predefined-bit shift register; and
   said trigger circuit comparing contents of said second predefined-bit shift register with a noise threshold select value to identify a noise event and generate a noise detector control output, said trigger circuit including a pair of multiple input multiplexers connected to selected latches of said second predefined-bit shift register and a noise threshold select input being applied to the multiple input multiplexers to control the sensitivity of the noise event detection; and said trigger circuit identifying said noise event based upon a selected amplitude of noise or a duration of noise for a specific period of time or a combination said selected amplitude of noise and said duration of noise for said specific period of time.

7. The circuit for implementing dynamic voltage sensing as recited in claim 6 includes an array coupled to said second predefined-bit shift register, said array storing a predetermined number of evaluations of said second predefined-bit shift register.

8. The circuit for implementing dynamic voltage sensing as recited in claim 7 includes said array being controlled using said noise detector control output.

9. The circuit for implementing dynamic voltage sensing as recited in claim 6 includes an output gate coupled to said pair of multiple input multiplexers, said output gate generating said noise detector control output.

10. The circuit for implementing dynamic voltage sensing as recited in claim 6 wherein each of said first quiet oscillator and said second noisy oscillator includes a respective on-chip high frequency oscillator.

11. The circuit for implementing dynamic voltage sensing as recited in claim 6 wherein said second noisy oscillator includes an on-chip oscillator having a noisy voltage supply input.

12. The circuit for implementing dynamic voltage sensing as recited in claim 6 wherein said first predefined-bit shift register includes an N-bit shift register and said second predefined-bit shift register includes a 2N-bit shift register; and a magnitude of noise on a monitored voltage supply affects the 1->0 boundary inside said 2N-bit shift register.

13. A design structure embodied in a non-transitory machine readable medium used in a design process, the design structure comprising:
   a circuit tangibly embodied in the non-transitory machine readable medium used in the design process, said circuit for implementing dynamic voltage sensing and including a trigger circuit, said circuit comprising:
   a first quiet oscillator generating a reference clock,
   a second noisy oscillator generating a noisy clock;
   a digital control loop matching a frequency of said first quiet oscillator and said second noisy oscillator;
   a first predefined-bit shift register being driven by the reference clock;
   a second predefined-bit shift register being driven by the noisy clock, said second predefined-bit shift register being greater than the first predefined-bit shift register;
   said second predefined-bit shift register being evaluated responsive to an overflow of said first predefined-bit shift register; and
   said trigger circuit comparing contents of said second predefined-bit shift register with a noise threshold select value to identify a noise event and generate a noise detector control output; and said trigger circuit including a pair of multiple input multiplexers connected to selected latches of said second predefined-bit shift register and a noise threshold select input being applied to the multiple input multiplexers to control the sensitivity of the noise event detection; said trigger circuit identifying said noise event based upon a selected amplitude of noise or a duration of noise for a specific period of time or a combination said selected amplitude of noise and said duration of noise for said specific period of time, wherein the design structure, when read and used in the manufacture of a semiconductor chip produces a chip comprising said circuit.

14. The design structure of claim 13, wherein the design structure comprises a netlist, which describes said circuit.

15. The design structure of claim 13, wherein the design structure resides on storage medium as a data format used for the exchange of layout data of integrated circuits.

16. The design structure of claim 13, wherein the design structure includes at least one of test data files, characterization data, verification data, or design specifications.

17. The design structure of claim 13, includes an array coupled to said second predefined-bit shift register, said array storing a predetermined number of evaluations of said second predefined-bit shift register.

* * * * *